(12) United States Patent
Kim

(10) Patent No.: US 6,653,556 B2
(45) Date of Patent: *Nov. 25, 2003

(54) CONDUCTIVE GASKET

(75) Inventor: Sun-Ki Kim, Kyonggi-do (KR)

(73) Assignee: Expan Electronics Co., Ltd., Kyonggi-do (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/538,966

(22) Filed: Mar. 31, 2000

(65) Prior Publication Data

US 2002/0108767 A1 Aug. 15, 2002

(30) Foreign Application Priority Data

Nov. 22, 1999 (KR) ........................................ 1999-25660

(51) Int. Cl.[7] ................................................ H05K 9/00
(52) U.S. Cl. ................................ 174/35 GC; 277/228; 277/229; 277/920
(58) Field of Search .................... 174/35 GC, 35 R, 174/35 MS; 361/816, 818; 277/227, 228, 229, 230, 920

(56) References Cited

U.S. PATENT DOCUMENTS

| 4,857,668 | A | * | 8/1989 | Buonanno | 174/35 GC |
|---|---|---|---|---|---|
| 5,028,739 | A | * | 7/1991 | Keyser et al. | 174/35 GC |
| 5,045,635 | A | * | 9/1991 | Kaplo et al. | 174/35 GC |
| 5,105,056 | A | * | 4/1992 | Hoge, Jr. et al. | 174/35 GC |
| 5,578,790 | A | * | 11/1996 | Peregrim | 174/35 GC |
| 6,075,205 | A | * | 6/2000 | Zhang | 174/35 GC |

* cited by examiner

Primary Examiner—Dean A. Reichard
Assistant Examiner—Carmelo Oliva
(74) Attorney, Agent, or Firm—Robert E. Bushnell, Esq.

(57) ABSTRACT

A conductive gasket includes: a non-conductive, elastic core; a flexible conductive cloth enclosing an outer surface of the core; a hot-melt adhesive inserted between the core and the conductive cloth to attach the core and the conductive cloth; a pressure sensitive adhesive (PSA) tape attached along the gasket to cover the ends of the conductive cloth; and a ridge formed on the PSA tape attached side of the conductive cloth. The conductive gasket is capable of forming a conduction path at all times between conductive members and enhances EMI/RFI shielding efficiency and contact reliability.

15 Claims, 4 Drawing Sheets

12# CONDUCTIVE GASKET

CLAIM OF PRIORITY

This application makes reference to, incorporates the same herein, and claims all benefits accruing under 35 U.S.C. §119 from the inventor's application CONDUCTIVE GASKET FOR IMPROVING CONTACT RELIABILITY filed with the Korean Industrial Property Office on Nov. 22, 1999 and there duly assigned Ser. No. 25660/1999.

BACKGROUND OF THE INVENTION

1. Field of the Invention

This invention relates to a conductive gasket for shielding electromagnetic radiation. More specifically, the conductive gasket forms a reliable conduction path between conductive members.

2. Description of the Related Art

Electromagnetic interference (EMI) is an undesirable electric disturbance that is induced or radiated from electric or electronic devices. Radio frequency interference (RFI) is generally referred to as EMI. More accurately, however, RFI is limited to the radio frequency part of the electronic spectrum, typically from 10 kHz to 10 GHz.

In order to shield an electrical or electronic device from such EMI/RFI, it is known to provide a conductive gasket capable of reducing energy level by absorbing or reflecting EMI/RFI. Such a conductive gasket forms a conduction path between an EMI/RFI generator and ground to provide shielding against generated EMI/RFI energy. Conductive gaskets have been continuously developed in a variety of shapes. A widely used conductive gasket is shown in FIG. 1.

However, such a conventional conductive gasket suffers from the following problem in actual use. A clearance may form between the edge of the gasket and the conductive surface to which it is attached, creating resistance. To overcome such a problem, use of a conductive pressure-sensitive adhesive (PSA) may be used. However, the conductive PSA is expensive and has an inferior adhesive strength to a non-conductive PSA. This results in increased manufacturing costs of the gasket and deteriorated adhering efficiency.

Moreover, for use in a minute-sized electronic device, the width of the gasket is necessarily narrowed. Then, the width of the PSA attached to the gasket must be accordingly narrowed. Yet, a predetermined amount of electric contact portion between the conductive member and the conductive cloth of the gasket is needed. When the width of the PSA is extremely narrowed, it is difficult to firmly attach the gasket to the conductive member. This results in poor manufacturing efficiency.

SUMMARY OF THE INVENTION

It is therefore an object of the present invention to provide a conductive gasket for improving EMI/RFI shielding efficiency and contact reliability, where the PSA is not necessarily conductive.

It is another object of the present invention to provide a conductive gasket for enhancing productivity and lowering manufacturing costs.

To achieve the above and the other objects of the present invention, the invention provides a conductive gasket including: a non-conductive, elastic core extending in a longitudinal direction; a flexible, electrically conductive cloth enclosing the outer surface of the core; a hot-melt adhesive inserted between the core and the conductive cloth to attach the core to the conductive cloth; a pressure sensitive adhesive (PSA) tape attached to the conductive cloth longitudinally in such a manner that the PSA tape covers the end portions of the conductive cloth; and a ridge formed on the PSA tape attached side of the conductive cloth.

According to an embodiment of the present invention, the ridge is formed by folding a portion of the conductive cloth over another portion and the ridge protrudes beyond the other portion. According to another embodiment of the present invention, the core is formed in such a manner that a portion thereof protrudes beyond the other portion.

The PSA may be conductive or non-conductive. For lower manufacturing costs and enhanced adhesion, it is desirable to use a non-conductive PSA.

BRIEF DESCRIPTION OF THE DRAWINGS

A more complete appreciation of the invention, and many of the attendant advantages, thereof, will be readily apparent as the same becomes better understood by reference to the following detailed description when considered in conjunction with the accompanying drawings in which like reference symbols indicate the same or similar components.

DETAILED DESCRIPTION OF THE PREFERRED EMBODIMENTS

Figures 1, 2:
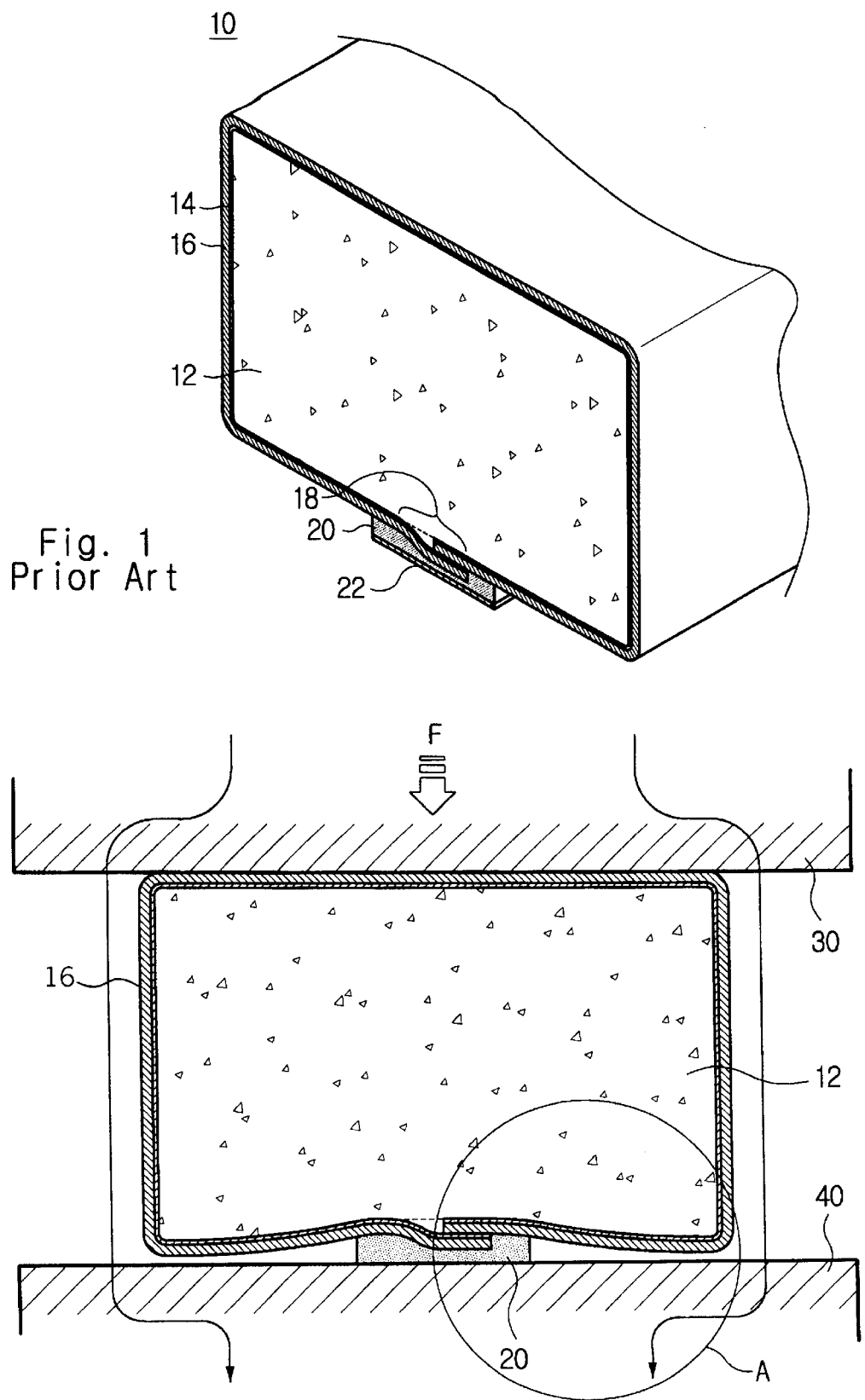
FIG. 1 is a perspective view of a conventional conductive gasket.
FIG. 2 is a descriptive view of the conductive gasket of FIG. 1 wherein a conduction path is formed.

A prior art gasket is shown in FIG. 1. Referring to FIG. 1, a prior art conductive gasket includes: a core 12; and a conductive cloth 16 enclosing the entire surface of core 12 in such a manner that an overlapped portion 18 is formed. A hot-melt adhesive 14 is inserted between the core 12 and the conductive cloth 16, for attaching the conductive cloth 16 to the core 12. A double sided pressure-sensitive adhesive (PSA) tape 20 is attached along the overlapped portion 18 of the conductive cloth 16, to fix the conductive gasket 10 to another member. Reference number 22 represents a separator attached to the bottom of PSA 20 tape.

Referring to FIG. 2, conductive gasket 10 of FIG. 1 is attached to a lower conductive member 40 by means of PSA 20 tape. When gasket 10 is pressed by an upper conductive member 30, core 12 of gasket 10 is pressed. The pressure F is accommodated by the elasticity of core 12. At this time, the end portions of the PSA tape 20 attached to the side of conductive cloth 16 come in contact with lower conductive member 40. As a result, a conduction path should be formed connecting the upper conductive member 30, the conductive cloth 16 of the conductive gasket 10, and the lower conductive member 40, as indicated by arrows of the drawing.

Figure 3:
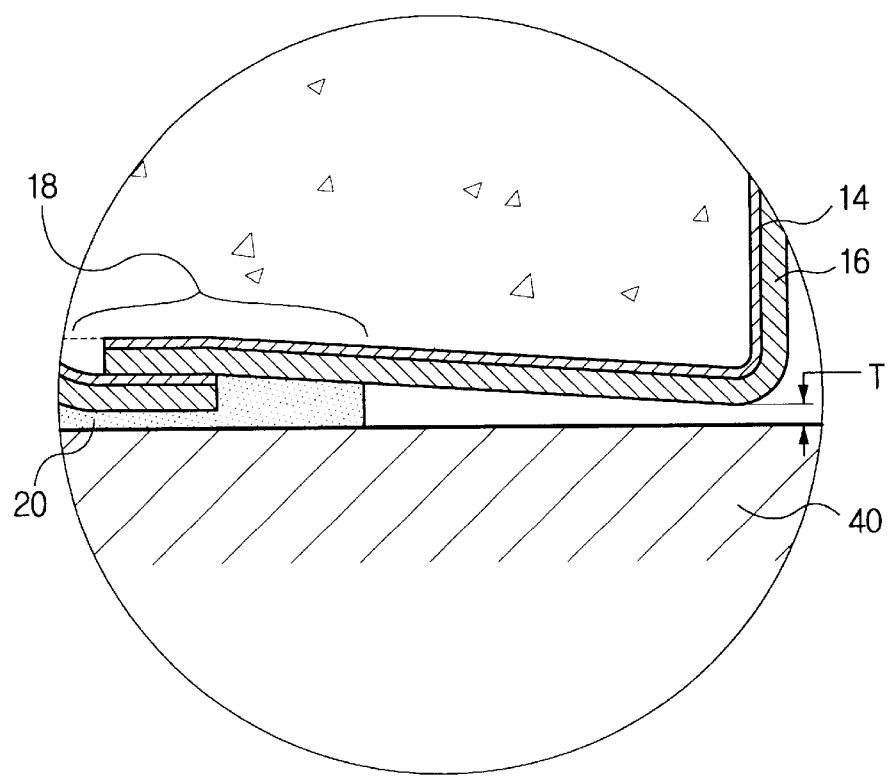
FIG. 3 is an enlarged view of portion A of FIG. 2.

Referring additionally to FIG. 3, as noted, this prior art structure leads to difficulties. First, the conductive gasket 10 has a planar structure on the PSA attached tape side thereof and PSA tape 20 attached to conductive gasket 10 has a certain thickness. In some cases therefore, a minute clearance T may be formed between conductive cloth 16 and lower conductive member 40, as shown in FIG. 3. No matter how minute the clearance is, the conduction path cannot be formed or contact resistance is increased. As a result, EMI/RFI shielding efficiency and contact reliability are degraded.

Turning now to the instant invention, two preferred embodiments of the present invention are described hereinafter with reference to the accompanying drawings.

Figure 4:
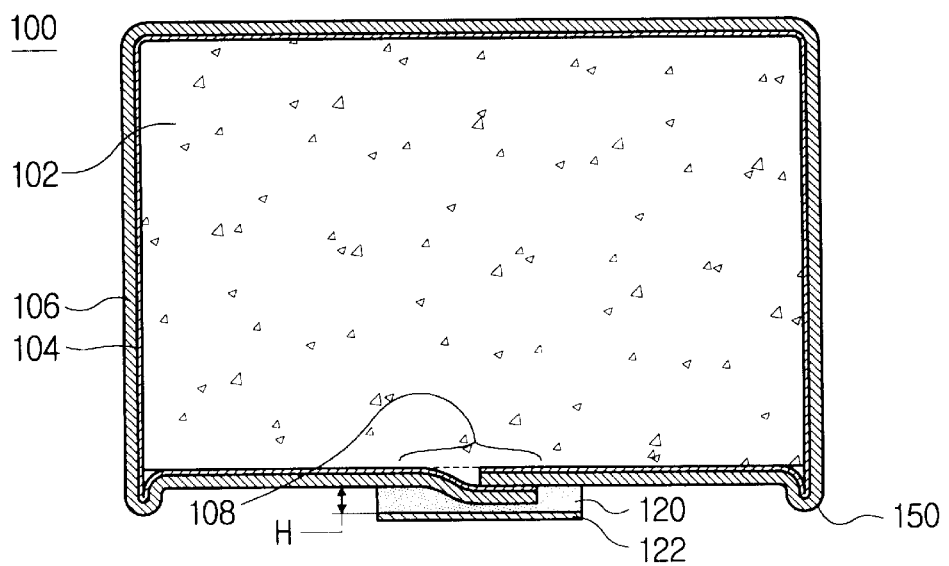
FIG. 4 is a perspective view of a conductive gasket according to an embodiment of the present invention.

Referring to FIG. 4, a conductive gasket 100 according to the present invention includes a flexible non-conductive core 102 extending longitudinally; and a conductive cloth 106 enclosing the entire outer surface of the core 102 in such a manner that an overlapped portion 108 is formed. A double-sided, pressure sensitive adhesive (PSA) tape 120 is attached to and covers overlapped portion 108 lengthwise. Tape 120 fixes the conductive gasket 100 to another member. A ridge 150 is formed on the PSA tape attached side of conductive cloth 106. Between the conductive cloth and core 102, a hot-melt adhesive 104 is provided so that conductive cloth 106 is attached to core 102. Reference number 122 represents a separator attached to the bottom of PSA tape 120.

The core is preferably an elastic, non-conductive elastomer. Urethane sponge, silicone sponge, neoprene sponge or rubber sponge may be used for core 102. In addition, an elastomer in liquid form may be used as sponge foam by foaming in conductive cloth 106.

The conductive cloth 106 is formed of polyester or nylon in woven fabric or non-woven fabric shape. Cloth 106 is given conductive characteristics through electroless plating, using copper, nickel, silver, or an alloy of copper, nickel or silver.

The hot-melt adhesive is in a non-adhesive solid state at room temperature and changed into an adhesive fluid state above a predetermined temperature. Accordingly, in manufacturing, the hot-melt adhesive is inserted as a film shape between conductive cloth 106 and core 102. The adhesive changes into liquid state at a predetermined temperature and atmosphere, and attaches conductive cloth 106 to core 102. Then, the hot-melt adhesive is returned to solid state at room temperature.

According to a first embodiment of the present invention, a ridge 150 is formed by folding the edge of the PSA tape attached side of conductive cloth 106. The ridge does not need to be formed on both edges of the PSA tape attached side of the conductive cloth 106 and may be formed on either of the edges. Furthermore, ridge 150 does not necessarily need to be formed on the edge and may be formed at any location between PSA 120 tape and the edge. It is desirable that the height H of ridge 150 is the same as or a little larger than the thickness of PSA tape 120.

For manufacturing convenience, ridge 150 is formed by forcibly folding a portion of conductive cloth 106, in the first embodiment. However, ridge 150 may also be formed by separately forming a structure corresponding to ridge 150 and attaching the separately formed structure.

As described hereinafter, according to the present invention, the PSA tape may be formed of conductive or non-conductive material. For lower manufacturing costs, it is desirable to use a non-conductive material.

Figure 5:
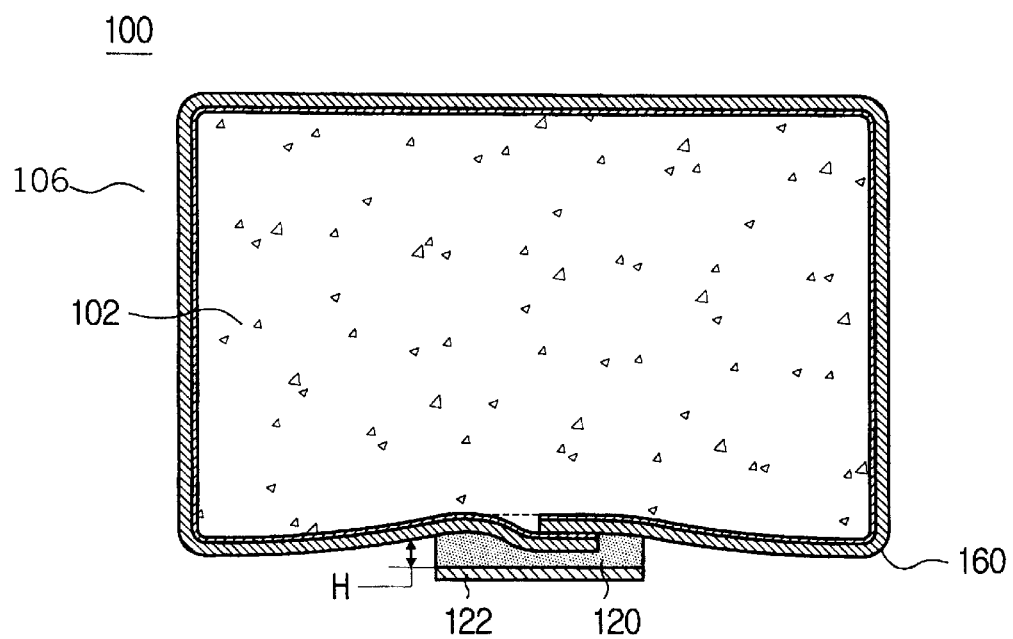
FIG. 5 is a perspective view of a conductive gasket according to another embodiment of the present invention.

Another embodiment of the conductive gasket according to the present invention is illustrated in FIG. 5. In FIG. 5, portions of core 102 corresponding to the edges of the PSA tape attached side of conductive cloth 106 protrudes beyond the other portion thereof. In other words, the PSA tape attached side of the core is carved in from the edges to the center. Therefore, conductive cloth 106 does not need to be folded along the edges. It is enough to form the core 102 as described above. By adjusting the shape of core 102 appropriately, larger contact portions can be obtained relative to the first embodiment.

Conductive gasket 100 is attached to a first conductive member after removing separator 122 attached to the bottom of the PSA tape. When a second conductive member presses the gasket 100 under this condition, core 102 accommodates the pressure and is pressed accordingly. Then, the PSA tape attached side of conductive cloth 106 comes in contact with the first conductive member. As a result, a conduction path is formed between the first and second conductive members.

In some circumstance experienced with prior art gaskets, a minute clearance may be formed between conductive cloth 106 and the conductive member with gasket 100 attached thereto. According to the present invention, however, since at least one ridge 160, having a height corresponding to the thickness of the PSA tape is formed, the conductive path does not fail to form. In other words, even though a minute clearance is generated, a conductive path is nonetheless formed by the ridge 160 according to the present invention. This provides enhanced reliability.

Figure 6:
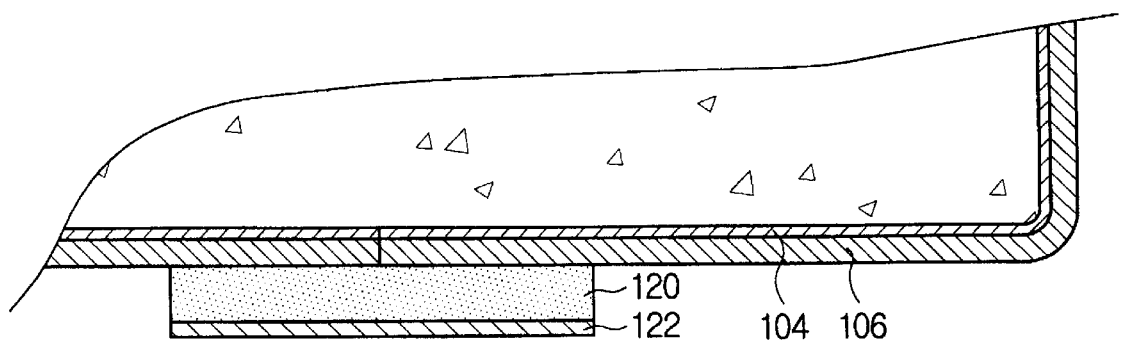
FIG. 6 is a fragmentary view of a conductive gasket of the present invention, wherein the ends of the conductive cloth meet each other.
Figure 7:
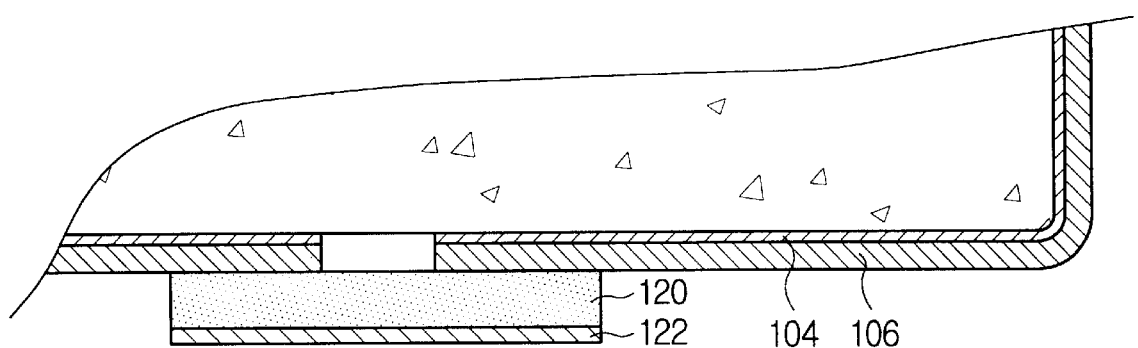
FIG. 7 is a fragmentary view of a conductive gasket of the present invention, wherein the ends of the conductive cloth are spaced apart from each other.

FIGS. 6 and 7 illustrate conductive gaskets in which the ends of the conductive cloth 106 are not overlapped. In FIG. 6, the ends of conductive cloth 106 meet each other. In FIG. 7, the ends of conductive cloth 106 are spaced apart from each other. The ridge according to the present invention can be also applied to remedy these situations.

Even when an extremely narrow gasket is used in small-sized electronic devices, a wide PSA tape 120 can be used for the gasket to form ridge 160 on the edge. Accordingly, even an extremely narrow gasket can be firmly attached to a conductive member by using a wide PSA tape 120. This results in enhanced efficiency of the gasket. Furthermore, the present invention advantageously provides enhanced productivity, by applying a wide PSA tape to an extremely narrow gasket for use in small-sized electronic devices and firmly attaching the gasket to a conductive member.

Moreover, even a low-priced, non-conductive PSA tape can enhance the shielding reliability. This results in reduced manufacturing costs.

As described above, the present invention provides an advantage of enhanced EMI/RFI shielding efficiency and contact reliability by forming a conductive path between conductive members at all times with at least one ridge having a height corresponding to the thickness of the PSA tape.

This invention has been described above with reference to the aforementioned embodiments. It is evident, however, that many alternatives, modifications and variations will be apparent to those having skill in the art in light of the foregoing description. Accordingly, the present invention embraces all such alternatives, modifications and variations as fall within the spirit and scope of the appended claims and their equivalents.

What is claimed is:

1. In a conductive gasket for shielding an electric or electronic device with respect to electromagnetic interference (EMI) or radio frequency interference (RFI), the conductive gasket comprising: a longitudinally extending, elastic, non-conductive core; a flexible, conductive cloth enclosing an outer surface of said core; a hot-melt adhesive inserted between said core and said conductive cloth, said adhesive attaching said core to said conductive cloth; and a pressure sensitive adhesive (PSA) tape longitudinally attached to said conductive cloth and covering longitudinally distanced ends thereof;

the improvement comprising:

a first portion of said conductive cloth being folded to form a ridge formed on a side of said conductive cloth with said PSA tape attached thereto, said ridge protruding beyond a second portion of said conductive cloth.

2. The gasket of claim 1, wherein said ridge is formed along edges of said side of said cloth with said PSA tape attached thereto.

3. The gasket of claim 1, wherein said PSA tape has a thickness T, said ridge has a height H, and $T \leq H$.

4. The gasket of claim 1, wherein said PSA tape is non-conductive.

5. A method of shielding an electronic or electric device with respect to EMI or RFI, said method comprising providing a conductive gasket located between a device to be shielded and a source of electromagnetic interference (EMI) or radio frequency interference (RFI), the gasket comprising: a longitudinally extending, elastic non-conductive core; a flexible, conductive cloth enclosing an outer surface of said core; a hot-melt adhesive inserted between said core and said conductive cloth, said adhesive attaching said core to said conductive cloth; and a pressure-sensitive adhesive (PSA) tape longitudinally attached to said conductive cloth and covering longitudinally distanced ends thereof; said gasket having a first portion of said conductive cloth being folded to form a ridge on a side of said conductive cloth with said PSA tape attached thereto, said ridge protruding beyond a second portion of said conductive cloth.

6. The method of claim 5, wherein said ridge is formed along edges of said side of said cloth with said PSA tape attached thereto.

7. The method of claim 5, wherein said PSA tape has a thickness T, said ridge has a height H, and $T \leq H$.

8. The method of claim 5, wherein said PSA tape is non-conductive.

9. A method of manufacturing a conductive gasket for shielding an electric or electronic device with respect to electromagnetic interference (EMI) or radio frequency interference (RFI), said method comprising:

providing a longitudinally extending, elastic non-conductive core;

enclosing an outer surface of said core with a flexible, conductive cloth;

inserting a hot-melt adhesive between said core and said conductive cloth, and attaching said core to said conductive cloth;

attaching a pressure sensitive adhesive tape longitudinally to said conductive cloth and covering longitudinally distanced ends thereof; and folding a first portion of said conductive cloth to form a ridge on a side of said conductive cloth with said tape attached thereto, so that said ridge protrudes beyond a second portion of said conductive cloth.

10. The method of claim 9, wherein said ridge is formed along edges of said side of said cloth with said PSA tape attached thereto.

11. The method of claim 9, wherein said PSA tape has a thickness T, said ridge has a height H, and $T \leq H$.

12. The method of claim 9, wherein said PSA tape is non-conductive.

13. A conductive gasket, comprised of:

an elongate elastic, non-conductive core extending in a longitudinal direction;

a flexible, conductive cloth enclosing an outer surface of said core, said conductive cloth having one side bearing an exterior first region and an exterior second region spaced-apart from said first exterior region by an intervening region of said one side;

an adhesive longitudinally attached to said first region to extend longitudinally along said first region between longitudinally distanced ends of said first region, said adhesive having a thickness that rises beyond said first region;

a ridge formed by an outer surface of said conductive cloth within said second region, said ridge beyond said first region by a distance not less than said thickness; and said conductive cloth along said second region exhibiting said ridge by forming a fold rising beyond said first region by a greater distance than said thickness.

14. The conductive gasket of claim 13, further comprising a hot melt adhesive inserted between said core and said conductive cloth, said adhesive attaching said core to said conductive cloth.

15. The conductive gasket of claim 13, further comprised of said conductive cloth forming said ridge by joining adjacent lengths of said conductive cloth together along said second region, with said adjacent lengths extending beyond said first region and said second region.

* * * * *